US007524606B2

(12) United States Patent
Chen et al.

(10) Patent No.: US 7,524,606 B2
(45) Date of Patent: Apr. 28, 2009

(54) NANOCOMPOSITE PHOTORESIST COMPOSITION FOR IMAGING THICK FILMS

(75) Inventors: Chunwei Chen, Piscataway, NJ (US); Ping-Hung Lu, Bridgewater, NJ (US); Hong Zhuang, Raritan, NJ (US); Mark Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 178 days.

(21) Appl. No.: 11/103,093

(22) Filed: Apr. 11, 2005

(65) Prior Publication Data

US 2006/0228644 A1 Oct. 12, 2006

(51) Int. Cl.
*G03F 7/00* (2006.01)
*G03F 7/004* (2006.01)

(52) U.S. Cl. ............... 430/270.1; 430/281.1; 430/905; 430/913; 430/917; 430/950

(58) Field of Classification Search .............. 430/270.1, 430/281.1, 905, 913, 917, 950
See application file for complete search history.

(56) References Cited

U.S. PATENT DOCUMENTS

| | | | |
|---|---|---|---|
| 4,336,319 A | 6/1982 | Nagashima et al. | |
| 4,522,958 A | 6/1985 | Das et al. | |
| 4,596,759 A | 6/1986 | Schupp et al. | |
| 4,623,670 A | 11/1986 | Mutoh et al. | |
| 4,792,517 A | 12/1988 | Klein et al. | |
| 5,043,184 A | 8/1991 | Fujii et al. | |
| 5,070,002 A | 12/1991 | Leech et al. | |
| 5,627,010 A | 5/1997 | Pai et al. | |
| 5,681,485 A | 10/1997 | Yamagami et al. | |
| 5,994,023 A * | 11/1999 | Van Damme et al. | 430/176 |
| 6,159,656 A * | 12/2000 | Kawabe et al. | 430/270.1 |
| 6,183,935 B1 | 2/2001 | Hanabata et al. | |
| 6,534,235 B1 * | 3/2003 | Hanabata et al. | 430/191 |
| 6,653,043 B1 * | 11/2003 | Hanabata | 430/270.1 |
| 6,783,914 B1 | 8/2004 | Fedynyshyn | |
| 6,852,465 B2 | 2/2005 | Dammel et al. | |
| 2002/0051942 A1 | 5/2002 | Takeuchi et al. | |
| 2003/0099897 A1 | 5/2003 | Fedynyshyn | |
| 2003/0198894 A1 | 10/2003 | Mizutani et al. | |
| 2004/0175653 A1 | 9/2004 | Zuang et al. | |

FOREIGN PATENT DOCUMENTS

| | | |
|---|---|---|
| JP | 08-36265 A | 2/1996 |
| JP | 11-338144 | 12/1999 |
| JP | 2002-67238 A | 3/2002 |
| WO | WO 01/63360 A2 | 8/2001 |
| WO | 2004053593 | 12/2003 |
| WO | WO 2004/053593 A2 | 6/2004 |
| WO | WO 2004/053593 A3 | 10/2004 |

OTHER PUBLICATIONS

English Language Abstract of JP 11-338144.
Office Action date mailed Aug. 28, 2006 for U.S. Appl. No. 11/103,134.
Invitation to Pay Additional Fees from the International Searching Authority in PCT application PCT/IB/2006/001127 corresponding to the above captioned application.
Invitation to Pay Additional Fees from the International Searching Authority in PCT application PCT/IB/2006/000738 corresponding to related case U.S. Appl. No. 11/103,134.
Derwent Abstract of JP 11-338144.
International Search Report to corresponding PCT application to U.S. Appl. No. 11/103,134.
Written Opinion issued in corresponding PCT application to U.S. Appl. No. 11/103,134.
International Search Report in PCT application of related case U.S. Appl. No. 11/103,093.
Written Opinion in PCT application of related case U.S. Appl. No. 11/103,093.
Office Action from U.S. Appl. No. 11/627,545.
English Language Abstract of JP 08-36265.
Notification Concerning Transmittal of International Preliminary Examination Report on Patentability (Form PCT/IB/326), International Preliminary Report on Patentability (Form PCT/IB/373), and Written Opinion of the International Searching Authority (Form PCT/ISA/237) for corresponding PCT application PCT/IB2006/001127 to U.S. Appl. No. 11/103,093).
Notification Concerning Transmittal of International Preliminary Examination Report on Patentability (Form PCT/IB/326), International Preliminary Report on Patentability (Form PCT/IB/373), and Written Opinion of the International Searching Authority (Form PCT/ISA/237) for corresponding PCT application PCT/IB2006/000738 to U.S. Appl. No. 11/103,134).
English translation from Japanese Patent Office of JP 2002-67238 A (as sent by United States Patent and Trademark Office), Mar. 5, 2002.
Waddell et al, "Silica, Amorphous Silica," Kirk-Othmer Encyclopedia of Chemical Technology, pp. 1 to 15; 23 to 25 (1997; posted online Dec. 3, 2000) (as sent by United States Patent and Trademark Office).
Office Action from co-pending U.S. Appl. No. 11/627,545, a divisional application of U.S. Appl. No. 11/103,134, now United States Patent No. 7,247,419.

* cited by examiner

*Primary Examiner*—Amanda C. Walke
(74) *Attorney, Agent, or Firm*—Sangya Jain

(57) ABSTRACT

The present invention relates to a photoresist composition suitable for image-wise exposure and development as a positive photoresist comprising a positive photoresist composition and an inorganic particle material having an average particle size equal or greater than 10 nanometers, wherein the thickness of the photoresist coating film is greater than 5 microns. The positive photoresist composition can be selected from (1) a composition comprising (i) a film-forming resin having acid labile groups, and (ii) a photoacid generator, or (2) a composition comprising (i) a film-forming novolak resin, and (ii) a photoactive compound, or (3) a composition comprising (i) a film-forming resin, (ii) a photoacid generator, and (iii) a dissolution inhibitor.

19 Claims, No Drawings

NANOCOMPOSITE PHOTORESIST COMPOSITION FOR IMAGING THICK FILMS

FIELD OF INVENTION

The present invention relates to a photoresist composition suitable for image-wise exposure and development as a positive photoresist comprising a positive photoresist composition and an inorganic particle material having an average particle size equal or greater than 10 nanometers, wherein the thickness of the photoresist coating film is greater than 5 microns. The positive photoresist composition can be selected from (1) a composition comprising (i) a film-forming resin having acid labile groups, and (ii) a photoacid generator, or (2) a composition comprising (i) a film-forming novolak resin, and (ii) a photoactive compound, or (3) a composition comprising (i) a film-forming resin, (ii) a photoacid generator, and (iii) a dissolution inhibitor.

BACKGROUND OF THE INVENTION

Photoresist compositions are used in microlithography processes for making miniaturized electronic components such as in the fabrication of computer chips and integrated circuits. Generally, in these processes, a coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble in such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, electrochemical deposition of electrical interconnects has been used as the density of the interconnects increases. For example, see Solomon, Electrochemically Deposited Solder Bumps for Wafer-Level Packaging, Packaging/Assembly, Solid State Technology, pages 84-88, April 2001; disclosure of which is incorporated herein by reference. Wafer level packaging produces a chip/die/device that is ready for direct assembly onto the final substrate or final system platform. Wafer-level packaging is used for making electrical connections to an integrated circuit chip above the active circuitry and is especially important as the density of inputs and outputs (I/Os) on chips increases.

Wafer-level packaging schemes use a technique known as redistribution to connect the peripheral pads to an area array of solder bumps on the surface of the wafer. The basic sequence of wafer-level packaging with redistribution involves creating a level of interconnect that defines an under-bump pad that is connected to the peripheral bonding pad. The under-bump pad is exposed by a via in a dielectric layer. Then the entire wafer receives an under-bump metallurgy (UBM) stack that provides an electroplating seed layer on top of a diffusion barrier and adhesion layer. The plating mask is formed in photoresist that can range from about 1 µm to over 200 µm thick, but are typically 25-125 µm thick. Layers exceeding about 100 µm to about 125 µm are typically applied in double coats. The solder bump is electroplated within the via in the case when a thicker photoresist is used. The solder bump is typically electroplated above the photoresist when it is <50 µm thick (overplating or mushroom plating). The photoresist is then stripped and the UBM is etched away everywhere it is not covered by the solder bumps. Finally, the bumps may be reflowed, causing them to reform in the shape of truncated spheres.

Gold bumps, copper posts and copper wires for redistribution in wafer level packaging require a resist mold that is later electroplated to form the final metal structures in advanced interconnect technologies. The resist layers are very thick compared to the photoresists used in the IC manufacturing. Both feature size and resist thickness are typically in the range of 5 µm to 100 µm, so that high aspect ratios (resist thickness to line size) have to be patterned in the photoresist.

Devices manufactured for use as microelectromechanical machines also use very thick photoresist films to define the components of the machine.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. Novolaks may also be reacted with quinine diazides and combined with a polymer.

Additives, such as surfactants, are often added to a photoresist composition to improve the coating uniformity of the photoresist film where the film thickness is less than 5 microns, especially to remove striations within the film. Various types of surfactants are added typically at levels ranging from about 5 ppm to about 200 ppm. U.S. Pat. No. 6,159,656 discloses the use of mixtures of surfactants from 0.01 to 2 parts by weight for a deep uv chemically amplified photoresist. These photoresists are used for high resolution deep UV lithography, where typically the film thickness of the photoresist film is less than 1 micron and surfactant levels greater than 100 ppm lead to surface defects, such as voids in the film. JP 95,021,626B2 discloses a novolak based photoresist containing a fluoro-chemical surfactant at 5 ppm.

Certain applications of the electronic industry, as discussed above, require photoresist films that are thicker than those used for high resolution lithography, where these thick films can typically be greater than 20 microns. In thick film applications the physical parameters of coating, baking and development can be quite different from those of thin films. Thick coatings of photoresist can exhibit defects such as, phase separation, striations, formation of microbubbles, etc. which can lead to nonuniform films after coating and also after development. The applicants have found that for photoresists, especially those comprising novolaks and quinone diazides, when these photoresists are coated at film thickness greater than 20 microns, these photoresists exhibit delay time instability. Delay time instability occurs when the thick photoresist films are coated and baked and then left for some extended period of time before they are exposed to irradiation. It has been observed that upon exposure and development of the photoresist film, the energy required to obtain an image increases with increasing delay time between bake and exposure. Delay time instability negatively impacts the device yield of the lithographic process and can lead to high cost of manufacture for these devices.

The applicants of the present invention have unexpectedly found that the addition of inorganic particle material does not cause the dark film loss. Dark film loss is a measure of the solubility of the unexposed photoresist film in the developing solution, and a minimal film loss is preferred. The nanocomposite photoresist of the present invention significantly increases the plasma etch resistance, heat deformation resistance, and mechanical stability.

The compositions of the present invention also have good plasma etch resistance and heat deformation resistance. The compositions of the present invention are also useful in the production of MEMS.

SUMMARY

The present invention relates to a photoresist composition suitable for image-wise exposure and development as a positive photoresist comprising a positive photoresist composition and an inorganic particle material having an average particle size equal or greater than 10 nanometers, wherein the thickness of the photoresist coating film is greater than 5 microns. The positive photoresist composition can be selected from (1) a composition comprising (i) a film-forming resin having acid labile groups, and (ii) a photoacid generator, or (2) a composition comprising (i) a film-forming novolak resin, and (ii) a photoactive compound, or (3) a composition comprising (i) a film-forming resin, (ii) a photoacid generator, and (iii) a dissolution inhibitor.

DESCRIPTION OF THE INVENTION

The present invention relates to a photoresist composition suitable for image-wise exposure and development as a positive photoresist comprising a positive photoresist composition and an inorganic particle material having an average particle size equal or greater than 10 nanometers, wherein the thickness of the photoresist coating film is greater than 5 microns. The positive photoresist composition can be selected from (1) a composition comprising (i) a film-forming resin having acid labile groups, and (ii) a photoacid generator, or (2) a composition comprising (i) a film-forming novolak resin, and (ii) a photoactive compound, or (3) a composition comprising (i) a film-forming resin, (ii) a photoacid generator, and (iii) a dissolution inhibitor.

Those of ordinary skill in the art are well familiar with photoresist compositions suitable for image-wise exposure and development as a positive photoresist.

Resin binders, such as novolaks and polyhydroxystyrenes, are typically used in photoresist compositions. The production of film forming, novolak resins which may be used for preparing photosensitive compositions, are well known in the art. A procedure for the manufacture of novolak resins is described in Phenolic Resins, Knop A. and Pilato, L.; Springer Verlag, N.Y., 1985 in Chapter 5 which is incorporated herein by reference. The polyhydroxystyrene can be any polyhydroxystyrene, including single polymers of vinylphenol and polyhydroxystyrenes having protecting groups such as acetals, t-butoxycarbonyl, and t-butoxycarbonylmethyl; copolymers of vinylphenol and an acrylate derivative, acrylonitrile, a methacrylate derivative, methacrylonitrile, styrene, or a styrene derivative such as a-methylstyrene, p-methylstyrene, o-hydrogenated resins derived from single polymers of vinylphenol; and hydrogenated resins derived from copolymers of vinylphenol and the above-described acrylate derivative, methacrylate derivative, or styrene derivative. One such example of this class of polymer is described in U.S. Pat. No. 4,491,628, the contents of which are incorporated herein by reference.

The novolak resins typically comprise the addition-condensation reaction product of at least one phenolic compound with at least one aldehyde source. The phenolic compounds include for example cresols (including all isomers), xylenols (such as 2,4-, 2,5-xylenols, 3,5 xylenol, and tri-methyl phenol).

Aldehyde sources that can be used in this invention include formaldehyde, paraformaldehyde, trioxane, acetaldehyde, chloroacetaldehyde, and reactive equivalents of these aldehyde sources. Among these formaldehyde and paraformaldehyde are preferable. In addition mixtures of two or more different aldehydes can be used.

The acid catalyst used for the addition-condensation reaction includes hydrochloric acid, sulfuric acid, formic acid, acetic acid, oxalic acid, p-toluenesulfonic acid and the like.

The photoactive component (hereafter referred to as PAC) can be any compound known to be useful for use in photoresist compositions. Preferably it is diazonaphthoquinone sulfonate ester of a polyhydroxy compound or monohydroxy phenolic compound. Photoactive compounds can be prepared by esterification of 1,2-napthoquinonediazide-5-sulfonyl chloride and/or 1,2-naphthoquinonediazide-4-sulfonyl chloride with a phenolic compound or a polyhydroxy compound having 2-7 phenolic moieties, and in the presence of basic catalyst. The use of o-diazonaphthoquinones as photoactive compounds is well known to the skilled artisan. These sensitizers which comprise a component of the present invention are preferably substituted diazonaphthoquinone sensitizers, which are conventionally used in the art in positive photoresist formulations. Such sensitizing compounds are disclosed, for example, in U.S. Pat. Nos. 2,797,213, 3,106,465, 3,148, 983, 3,130,047, 3,201,329, 3,785,825 and 3,802,885. Useful photosensitizers include, but are not limited to, the sulfonic acid esters made by condensing phenolic compounds such as hydroxy benzophenones, oligomeric phenols, phenols and their derivatives, novolaks and multisubstituted-multihydroxyphenyl alkanes with naphthoquinone-(1,2)-diazide-5-sulfonyl chloride or naphtho-quinone-(1,2)-diazide-4-sulfonyl chlorides. In one preferred embodiment monohydroxy phenols such as cumylphenol are preferred.

In another embodiment, preferably, the number of the phenolic moieties per one molecule of the polyhydroxy compound used as a backbone of PAC is in the range of 2-7, and more preferably in the range of 3-5.

Some representative examples of polyhydroxy compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

(b) Polyhydroxyphenylalkylketones such as 2,3,4-trihydroxyacetophenone, 2,3,4-trihydroxyphenylpentylketone, and 2,3,4-trihydroxyphenylhexylketone;

(c) Bis(polyhydroxyphenyl)alkanes such as bis(2,3,4-trihydroxyphenyl)methane, bis(2,4-dihydroxyphenyl)methane, and bis(2,3,4-trihydroxyphenyl)propane;

(d) Polyhydroxybenzoates such as propyl 3,4,5-trihydroxybenzoate, phenyl 2,3,4-trihydroxybenzoate, and phenyl 3,4,5-trihydroxybenzoate;

(e) Bis (polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

(f) Alkylene di(polyhydroxybenzoates) such as ethylene glycol-di(3,5-dihydroxybenzoate) and ethylene glycoldi(3,4,5-trihydroxybenzoate);

(g) Polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

(h) Bis(polyhydroxy)sulfides such as 4,4'-thiobis(1,3-dihydroxy)benzene;

(i) Bis(polyhydroxyphenyl)ethers such as 2,2'4,4'-tetrahydroxydiphenyl ether;

(j) Bis(polyhydroxyphenyl)sulfoxides such as 2,2',4,4'-tetrahydroxydiphenylsulfoxide;

(k) Bis(polyhydroxyphenyl)sulfones such as 2,2',4,4'-tetrahydroxydiphenylsulfone;

(l) Polyhydroxytriphenylmethanes such as tris(4-hydroxyphenyl)methane, 4,4',4''-trihydroxy-3,5,3',5'-tetramethyltriphenylmethane, 4,4',3'',4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5'-diacetyltriphenylmethane, and 2,4,6,2',4',6'-hexahydroxy-5,5'-dipropionyltriphenylmethane;

(m) Polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane-4,5,6,4',5',6'-hexol;

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) Polyhydroxy compounds described in JP No. 4-253058 such as α,α',α''-tris (4-hydroxyphenyl)-1,3,5-triisopropylbenzene, α,α',α''-tris(3,5-dimethyl-4-hydroxyphenyl)-1,3,5-triisopropylbenzene, α,α',α''-tris (3,5-diethyl-4-hydroxyphenyl)-1,3,5-triisopropylbenzene, α,α',α''-tris (3,5-di-n-propyl-4-hydroxyphenyl)-1,3,5-tri-isopropylbenzene, α,α',α''-tris(3,5-diisopropyl-4-hydroxyphenyl)-1,3,5-triisopropylbenzene, α,α',α''-tris(3,5-di-n-butyl-4-hydroxyphenyl)-1,3,5-triisopropylbenzene, α,α',α''-tris (3-methyl-4-hydroxyphenyl)-1,3,5-triisopropyl-benzene, α,α',α''-tris(3-methoxy-4-hydroxyphenyl)-1,3,5-triisopropylbenzene, α,α',α''-tris(2,4-dihydroxyphenyl)-1,3,5-triisopropylbenzene, 2,4,6-tris(3,5-dimethyl-4-hydroxyphenylthiomethyl)mesitylene, 1-[α-methyl-α-(4''-hydroxyphenyl)ethyl]-4-[α,α'-bis(4''-hydroxyphenyl)ethyl]benzene, 1-[α-methyl-α-(4'-hydroxyphenyl)ethyl]-3-[α,α'-bis(4''-hydroxy-phenyl)ethyl]benzene, 1-[α-methyl-α-(3',5'-dimethyl-4'-hydroxyphenyl)ethyl]benzene, 1-[α-methyl-α-(3'-methoxy-4'-hydroxyphenyl)ethyl]-4-[α',α'-bis(3'-methoxy-4'-hydroxyphenyl)ethyl]benzene, and 1-[α-methyl-α-(2',4'-dihydroxyphenyl)ethyl]-4-[α',α'-bis(4'-hydroxyphenyl)ethyl]-benzene.

Other examples of o-quinonediazide photoactive compounds include condensation products of novolak resins with an o-quinonediazide sulfonyl chloride. These condensation products (also called capped novolaks) may be used instead of o-quinonediazide esters of polyhydroxy compounds or used in combination therewith. Numerous U.S. Patents describe such capped novolaks. U.S. Pat. No. 5,225,311 is one such example. Mixtures of various quinone-diazide compounds may also be used.

Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyidiazomethanes, triphenylsulfonium tris(trifluoromethylsulfonyl)methide, triphenylsulfonium bis(trifluoromethylsulfonyl)imide, diphenyliodonium tris(trifluoromethylsulfonyl) methide, diphenyliodonium bis(trifluoromethylsulfonyl) imide and their homologues are also possible candidates.

Examples of photoresist compositions based on film-forming resins having acid labile groups and photoacid generators are described, for example, in U.S. Pat. No. 6,447,980, the contents of which is incorporated herein by reference.

Generally, film-forming resins include those of the general formula

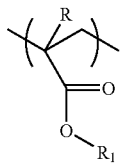

where R is hydrogen or $C_1$-$C_4$ alkyl and $R_1$ is an acid liable group, as well as

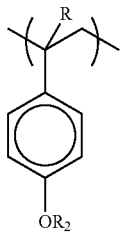

where R is as defined above and $R_2$ is hydrogen or an acid labile group, wherein the phenolic hydroxyl group is partially or fully protected by an acid labile group, preferably by one or more protective groups which form acid cleavable C—O—C or C—O—Si bonds. For example, and without limitation, include acetal or ketal groups formed from alkyl or cycloalkyl vinyl ethers, silyl ethers formed from suitable trimethylsilyl or t-butyl(dimethyl)silyl precursors, alkyl ethers formed from methoxymethyl, methoxyethoxymethyl, cyclopropylmethyl, cyclohexyl, t-butyl, amyl, 4-methoxybenzyl, o-nitrobenzyl, or 9-anthrylmethyl precursors, t-butyl carbonates formed from t-butoxycarbonyl precursors, and carboxylates formed from t-butyl acetate precursors, and t-butoxycarbonylmethyl.

Additional film forming resins are also disclosed in U.S. patent application Ser. No. 10/658,840, filed Sep. 9, 2003, the contents of which are hereby incorporated by reference herein.

In situations where the composition uses a dissolution inhibitor, $R_1$ in the above formula need not be an acid labile group. As is well known in the art, an acid labile group reflects those groups which are resistant to basic conditions but are removable under acidic conditions.

Other types of resin binders suitable for use in the positive photoresist composition include those disclosed in U.S. Pat. No. 4,491,628 and U.S. Pat. No. 6,358,665, the contents thereof are hereby incorporated herein by reference.

Another component of the negative photoresist composition is an inorganic particle material. Suitable inorganic particle materials which can be used include metals, metal salts, metallic oxides, and combinations thereof. Suitable metals those in Groups VIB, VIIB, VIIIB, IB, IIB, IIA, IVA, VA, VIA and combinations thereof. Suitable examples of metals include titanium, vanadium, cobalt, hafnium, boron, gold, silver, silicon, aluminum, copper, zinc, gallium, magnesium, indium, nickel, germanium, tin, molybdenum, niobium, zirconium, platinum, palladium, antimony, and combinations thereof. Suitable examples of metal salts include halides, carbides and nitrides, such as silicon carbide, silicon nitride and combinations thereof. Examples of metallic oxides include those available from the Groups mentioned above and combinations thereof. Suitable examples include magnesium oxide, iron (III) oxide, aluminum oxide, chromium oxide, zinc oxide, titanium dioxide, silicon dioxide and combinations thereof. In general, the average particle size (diameter) of the inorganic particle is between about 1 and 100 nm, further between about 10 and about 50 nm, and further between about 10 and about 20 nm, as well as between about 20 to about 50 nm.

Typically the percentage content of the inorganic particle material is between about 0.1% and about 90% by weight of the photoresist composition; further between about 5% and about 75% and further between about 10% and about 50% by weight and even further between about 10% and about 30% by weight.

In useful embodiments, when the inorganic particle material is added to a photoresist composition, it has been unexpectedly discovered that the combination of the inorganic particle material and resin binder allows for the formation of thick photoresist films.

Typically, the thickness of the photoresist composition containing inorganic particle material on a substrate is between about 5 to about 150 μm, further between about 10 and about 150 μm, further between about 10 and about 100 μm, and even further between about 20 μm and 80 μm.

For example, colloidal silica ($SiO_2$) can be prepared in 1 to 100 nm diameter particles, and is commercially available as 8-10 nm, 10-15 nm, 10-20 nm, 17-23 nm, and 40-50 nm particles. Such colloidal silicas are available from, for example, Nissan Chemicals. In some instances, the colloidal silicas are supplied in various solvents which are not very useful in the photoresist area. In most instances, it is beneficial to disperse the colloidal silica in a solvent which is useful, for example, propylene glycol mono-methyl ether.

In the preferred embodiment, the solid parts of the photoresist composition preferably range from 95% to about 40% resin with from about 5% to about 50% photoactive component. A more preferred range of resin would be from about 50% to about 90% and most preferably from about 65% to about 85% by weight of the solid photoresist components. A more preferred range of the photoactive component would be from about 10% to about 40% and most preferably from about 15% to about 35%, by weight of the solid in the photoresist.

Other additives such as colorants, non-actinic dyes, plasticizers, adhesion promoters, coating aids, sensitizers, crosslinking agents, surfactants, and speed enhancers may be added to the photoresist composition suitable for image-wise exposure and development as a positive photoresist before the solution is coated onto a substrate. In certain positive photoresist compositions, for example, a positive photoresist composition comprising (i) a film-forming novolak resin, and (ii) a photoactive compound, it is preferred to add surfactants to the composition in an amount ranging from 2,000 ppm to 14,000 ppm, more preferably from about 2,500 ppm to about 10,000 ppm and even more preferably from about 3,000 to about 8,000 ppm. In so doing, certain film defects, such as voids, poor photosensitivity, phase separation, poor film uniformity, microbubble formulations during bake can be avoided. The type of surfactant to be added include nonionic based surfactants such as fluorinated and silicone containing surfactants, alkyl ethoxylated surfactants, block copolymer surfactants, and sorbitan ester surfactants as well as those well known to those skilled in the art. Other examples include alkyl alkoxylated surfactant, such as addition products of ethylene oxide, or propylene oxide, with fatty alcohols, fatty acids, fatty amines, etc.

Suitable solvents for photoresists may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include, without limitation, silicon, aluminum, polymeric resins, silicon dioxide, metals, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to substrates such as those which are utilized in the production of microprocessors and other miniaturized integrated circuit components. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 50° C. to about 200° C. for from about 30 seconds to about 6 minutes (or even longer) on a hot plate or for from about 15 to about 90 minutes (or even longer) in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a coating of photoresist composition, on the order of 10-150 microns (micrometer) in thickness, remains on the substrate. Multiple coatings may be done to achieve thick films. In a preferred embodiment the temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 157 nm (nanometers) to about 450 nm, x-ray, electron beam, ion beam or laser radiation, as well as other sub-200 nm wavelengths, in any desired pattern, produced by use of suitable masks, negatives, stencils, templates, etc. Generally, thick photoresist films are exposed using broadband radiation, using equipments such as Ultratech, Karl Süss or Perkin Elmer broadband exposure tools, although 436 nm, 365 nm, and 248 nm Steppers may also be used.

The photoresist is then optionally subjected to a post exposure second baking or heat treatment either before or after development. The heating temperatures may range from about 90° C. to about 150° C., more preferably from about 100° C. to about 140° C. The heating may be conducted for from about 30 seconds to about 3 minutes, more preferably from about 60 seconds to about 2 minutes on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred hydroxide is tetramethyl ammonium hydroxide. Other preferred bases are sodium or potassium hydroxide. Additives, such as surfactants, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

1) Preparation of Colloidal Silica Dispersed in Propylene Glycol Mono-Methyl Ether (PGME-CS)

Dispersions of silica nanoparticles in PGME were prepared by solvent displacement from NPC-ST-30 (silica nanoparticles in ethylene glycol mono-n-propyl ether, 10-15 nm in diameter, manufactured by Nissan Chemical, a solid matter content of silica of 30% by weight). The solvent of ethylene glycol mono-n-propyl ether was removed by distillation under vacuum. Colloidal silica was redispersed in PGME (PGME-CS) by ultrasonicating for 2 hours and the solid content was 26.2% by weight.

2) Positive Nanocomposite Resists 2-1. Preparation of Positive Nanocomposite Resists Containing PGME-CS.

Five solutions of positive nanocomposite resists from containing PGME-CS were prepared by adding the PGME-CS colloidal silica solution from 1) into AZ 50XT (from AZ Electronic Materials USA Corp., polymer resin in propylene glycol mono-methyl ether acetate with a solid content 49.4% by weight) as shown in Table 1. The solutions were rolled overnight at room temperature and used without filtration. The solutions were transparent and the silica contents were 10-50% by weight (solid matter base). The solvent contents in the nanocomposite resists were in the range of 50-66% by weight. The nanocomposite resists with high viscosity are suitable for thick film application. The silica nanoparticles were incorporated into the polymer matrices homogeneously without agglomeration. No precipitation was observed after 3 months.

TABLE 1

|  | AZ 50XT, (g) | PGME-CS, (g) | Silica content in solid (%, by weight) |
|---|---|---|---|
| Sample 1 | 10 | 0 | 0 |
| Sample 2 | 10 | 2.1 | 10 |
| Sample 3 | 10 | 3.3 | 15 |
| Sample 4 | 10 | 4.7 | 20 |
| Sample 5 | 10 | 8.1 | 30 |
| Sample 6 | 10 | 18.8 | 50 |

2-2. Preparation of Positive Nanocomposite Resists Containing PGME-CS.

3.5 g of PGME-CS was added to 10 g of AZ 40XT (from AZ Electronic Materials USA Corp., polymer resin in propylene glycol mono-methyl ether acetate and cyclohexanone with a solid content 52% by weight). The solution was rolled overnight at room temperature and used without filtration. The solution was transparent and the silica contents were 15% by weight (solid matter base).

2-3. Lithography Performance

The photoresist solutions in Table 1 were coated onto 6 inch silicon wafers and baked at 113° C. for 5 minutes to give a coating of 5-40 µm. The wafers were exposed on a Karl Suss broadband exposure tool with at least one hour delay between baking and exposure. The wafers were developed immediately after exposure using AZ 400K (1:4 diluted, available from AZ Electronic Materials USA Corp.).

The nanocomposite resists exhibited fast photospeed, good resolution and straight profile. According to the film thickness measurement, no dark film loss was observed for the positive resists. When silica nanoparticles were dispersed homogeneously in polymer matrices, the polymer provided a protective layer which retards dissolution of silica in the unexposed parts. On the other hand, hydroxyl groups on the surface of silica nanoparticles (the hydrophilic surface) contributed the high dissolution rate in the exposed parts.

The nanocomposite resists exhibited good shelf stability. After 2 months, the aged resists showed the same lithographic performance as the as-prepared samples.

The photoresist solution from 2-2 was coated onto 6 inch silicon wafers and baked at 115° C. for 5 minutes to give a coating of 24 µm. The wafers were exposed on a Karl Suss broadband exposure tool developed immediately after exposure using AZ 300 MIF (available from AZ Electronic Materials USA Corp.) with 2 puddles of 60 second each. The photoresist solution from 2-2 exhibited fast photospeed, good resolution and straight profile. Additionally, no dark film loss was observed.

The invention claimed is:

1. A photoresist composition suitable for image-wise exposure and development comprising a positive photoresist composition and a nonfunctionalized inorganic particle material, the inorganic particle material being dispersed in propylene glycol mono-methyl ether prior to mixing with the positive photoresist composition, having an average particle size equal or greater than 10 nanometers, wherein the photoresist composition is capable of forming a photoresist coating film with a thickness greater than 5 microns.

2. The photoresist composition of claim 1 wherein the positive photoresist composition selected from
  (1) a composition comprising (i) a film-forming resin having acid labile groups, and (ii) a photoacid generator, or
  (2) a composition comprising (i) a film-forming novolak resin, and (ii) a photoactive compound, or
  (3) a composition comprising (i) a film-forming resin, (ii) a photoacid generator, and (iii) a dissolution inhibitor.

3. The photoresist composition of claim 2 wherein the positive photoresist composition is (1) a composition comprising (i) a film-forming resin having acid labile groups, and (ii) a photoacid generator.

4. The photoresist composition of claim 2 wherein the positive photoresist composition is (2) a composition comprising (i) a film-forming novolak resin, and (ii) a photoactive compound.

5. The photoresist composition of claim 2 wherein the positive photoresist composition is (3) a composition comprising (i) a film-forming resin, (ii) a photoacid generator, and (iii) a dissolution inhibitor.

6. The photoresist composition according to claim 1, where the film has a thickness greater than 10 microns.

7. The photoresist composition according to claim 1, where the film has a thickness greater than 20 microns.

8. The photoresist composition according to claim 1, where the film has a thickness less than 150 microns.

9. The photoresist composition according to claim 1, where the inorganic particle material is colloidal silica.

10. The photoresist composition according to claim 1, where the inorganic particle material has an average particle size from about 10 to about 50 nanometers.

11. The photoresist composition according to claim 1, where the inorganic particle material has an average particle size from about 20 to about 50 nanometers.

12. The photoresist composition according to claim 1, where the inorganic particle material is present in an amount of from about 0.1% and about 90% by weight of the photoresist.

13. The photoresist composition according to claim 1, where the inorganic particle material is present in an amount of from about 5% and about 75% by weight of the photoresist.

14. The photoresist composition according to claim 1, where the inorganic particle material is present in an amount of from about 10% and about 50% by weight of the photoresist.

15. The photoresist composition according to claim 1, where the inorganic particle material is present in an amount of from about 10% and about 30% by weight of the photoresist.

16. The photoresist composition according to claim 4, which further contains a nonionic surfactant.

17. The photoresist composition according to claim 16, where the surfactant is a fluorinated and /or a silicone polymer.

18. The photoresist composition according to claim 4, where the photoactive compound is a reaction product of a 2,1,5-, or 2,1,4-diazonaphthoquinone compound and a hydroxyl containing compound.

19. A process of forming a positive photoresist image on a substrate, comprising the steps of:
  (a) coating the photoresist composition of claim 1 on a substrate, thereby forming a photoresist coating film with a thickness greater than 5 microns;
  (b) image-wise exposing the coated substrate to actinic radiation; and
  (c) developing the exposed substrate to form the photoresist image.

* * * * *